US 6,541,867 B1

(12) United States Patent
Fjelstad

(10) Patent No.: US 6,541,867 B1
(45) Date of Patent: Apr. 1, 2003

(54) MICROELECTRONIC CONNECTOR WITH PLANAR ELASTOMER SOCKETS

(75) Inventor: Joseph Fjelstad, Sunnyvale, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 09/625,895

(22) Filed: Jul. 26, 2000

Related U.S. Application Data

(62) Division of application No. 08/987,570, filed on Dec. 11, 1997, now Pat. No. 6,133,072.
(60) Provisional application No. 60/033,148, filed on Dec. 13, 1996.

(51) Int. Cl.[7] .......................... H01L 23/48; H01L 29/40
(52) U.S. Cl. .................. 257/773; 257/774; 257/775; 257/776; 257/777; 257/778; 257/779; 257/780; 257/781
(58) Field of Search ................................ 257/773, 774, 257/775, 776, 777, 778, 779, 780, 781

(56) References Cited

U.S. PATENT DOCUMENTS

| 3,373,481 A | 3/1968 | Lins et al. |
| 3,795,037 A | 3/1974 | Luttmer |
| 3,811,186 A | 5/1974 | Larnerd et al. |
| 4,067,104 A | 1/1978 | Tracy |
| 4,142,288 A | 3/1979 | Flammer et al. |
| 4,326,663 A | 4/1982 | Oettel |
| 4,447,857 A | 5/1984 | Marks et al. |
| 4,520,562 A | 6/1985 | Sado et al. |
| 4,629,957 A | 12/1986 | Walters et al. |
| 4,661,192 A | 4/1987 | McShane |
| 4,667,219 A | 5/1987 | Lee et al. |
| 4,785,137 A | 11/1988 | Samuels |
| 4,793,814 A | 12/1988 | Zifcak et al. |
| 4,858,074 A | 8/1989 | Mallet et al. |
| 4,893,172 A | 1/1990 | Matsumoto et al. |

(List continued on next page.)

FOREIGN PATENT DOCUMENTS

| EP | 0 072 673 | 2/1983 |
| GB | 2142568 | 1/1985 |
| GB | 2151529 | 7/1985 |
| JP | 61-091939 | 5/1986 |

OTHER PUBLICATIONS

"Method of Testing Chips and Joining Chips to Substrates", Research Disclosure, Feb., 1991, No. 322, Kenneth Mason Publication Ltd., England.

Primary Examiner—Archene Turner
(74) Attorney, Agent, or Firm—Lerner, David, Littenberg, Krumholz & Mentlik, LLP

(57) ABSTRACT

A component for mounting semiconductor chips or other microelectronic units includes a compliant, sheet-like body with arrays of sheet-like conductive pads on upper and lower surfaces of the body. Flexible leads extending through the body interconnect conductive pads on the upper and lower surfaces. The leads are desirably formed from wire, such as gold wire, that is bonded to the conductive pads using a conductive epoxy or a eutectic bonding alloy. The component is made using sacrificial base sheets having conductive terminal portions to which the leads are initially bonded. The compliant body is formed by injecting a flowable material between the base sheets, curing the material and removing the base sheets by etching. The flowable material surrounds the leads such that the leads are supported by the cured compliant layer. The component may be used as an interposer or as a test socket.

14 Claims, 10 Drawing Sheets

U.S. PATENT DOCUMENTS

| | | |
|---|---|---|
| 4,926,241 A | 5/1990 | Carey |
| 4,926,549 A | 5/1990 | Yoshizawa et al. |
| 4,949,158 A | 8/1990 | Ueda |
| 4,954,877 A | 9/1990 | Nakanishi et al. |
| 4,954,878 A | 9/1990 | Fox et al. |
| 4,955,523 A | 9/1990 | Calomagno et al. |
| 5,014,111 A | 5/1991 | Tsuda et al. .................. 357/68 |
| 5,047,830 A | 9/1991 | Grabbe |
| 5,049,085 A | 9/1991 | Reylek et al. |
| 5,067,007 A | 11/1991 | Kanji et al. |
| 5,072,289 A | 12/1991 | Sugimoto et al. |
| 5,086,337 A | 2/1992 | Noro et al. |
| 5,090,119 A | 2/1992 | Tsuda et al. .................. 29/843 |
| 5,106,308 A | 4/1992 | Gollomp et al. |
| 5,131,852 A | 7/1992 | Grabbe et al. |
| 5,148,265 A | 9/1992 | Khandros et al. |
| 5,148,266 A | 9/1992 | Khandros et al. |
| 5,152,695 A | 10/1992 | Grabbe et al. |
| 5,173,055 A | 12/1992 | Grabbe |
| 5,197,892 A | 3/1993 | Yoshizawa et al. |
| 5,230,931 A | 7/1993 | Yamazaki et al. |
| 5,254,811 A | 10/1993 | Ludden et al. |
| 5,258,330 A | 11/1993 | Khandros et al. |
| 5,282,312 A | 2/1994 | DeStefano et al. |
| 5,371,654 A | 12/1994 | Beaman et al. |
| 5,399,982 A | 3/1995 | Driller et al. |
| 5,430,614 A | 7/1995 | Difrancesco |
| 5,435,732 A | 7/1995 | Angulas et al. |
| 5,455,390 A | 10/1995 | DiStefano et al. |
| 5,474,458 A | 12/1995 | Vafi et al. |
| 5,477,160 A | 12/1995 | Love |
| 5,518,964 A | 5/1996 | DiSteffano et al. |
| 5,528,083 A | 6/1996 | Malladi et al. |
| 5,531,022 A | 7/1996 | Beaman et al. |
| 5,622,590 A | 4/1997 | Kunitomo et al. .......... 156/291 |
| 5,628,919 A | 5/1997 | Tomura et al. ............... 216/18 |
| 5,640,051 A | 6/1997 | Tomura et al. ............. 257/778 |

MICROELECTRONIC CONNECTOR WITH PLANAR ELASTOMER SOCKETS

This application is a divisional application of application Ser. No. 08/987,570 filed Dec. 11, 1997, now U.S. Pat. No. 6,133,072, which claims the benefit of.

The present application claims priority to U.S. Provisional Patent Application No. 60/033,148, filed Dec. 13, 1996, the subject matter of which is hereby incorporated in its entirety herein.

FIELD OF THE INVENTION

The present invention relates to semiconductor chip assemblies and to methods and components useful in making such assemblies.

BACKGROUND OF THE INVENTION

Complex microelectronic devices such as modern semiconductor chips require numerous connections to other electronic components. For example, a complex microprocessor chip may require many hundreds of connections to external devices.

Semiconductor chips commonly have been connected to electrical traces on mounting substrates by one of three methods: wire bonding, tape automated bonding, and flip-chip bonding. In wire bonding, the semiconductor chip is positioned on a substrate with a bottom or back surface of the chip abutting the substrate and with the contact-bearing front or top surface of the chip facing upwardly, away from the substrate. Individual gold or aluminum wires are connected between the contacts on the semiconductor chip and current conducting pads on the substrate. In tape automated bonding a flexible dielectric tape with a prefabricated array of leads thereon is positioned over the semiconductor chip and substrate, and the individual leads are bonded to the contacts on the chip and to the current conducting pads on the substrate. In both wire bonding and conventional tape automated bonding, the current conducting pads on the substrate are arranged outside of the area covered by the semiconductor chip, so that the wires or leads fan out from the chip to the surrounding current conducting pads. The area covered by the subassembly as a whole is considerably larger than the area covered by the chip. This makes the entire assembly substantially larger than it otherwise would be. Because the speed with which a microelectronic assembly can operate is inversely related to its size, this presents a serious drawback. Moreover, the wire bonding and tape automated bonding approaches are generally most workable with semiconductor chips having contacts disposed in rows extending along the periphery of the chip. They generally do not lend themselves to use with chips having contacts disposed in a so-called area array; i.e., a grid-like pattern covering all or a substantial portion of the chip front surface.

In the flip-chip mounting technique, the contact bearing surface of the semiconductor chip faces towards the substrate. Each contact on the semiconductor chip is joined by a solder bond to the corresponding current carrying pad on the substrate, as by positioning solder balls on the substrate or contacts of the semiconductor chip, juxtaposing the chip with the substrate in the front-face-down orientation and momentarily melting or reflowing the solder. The flip-chip technique yields a compact assembly, which occupies an area of the substrate no larger than the area of the chip itself. However, flip-chip assemblies suffer from significant problems with thermal stress. The solder bonds between the contacts on the semiconductor chip and the current carrying pads on the substrate are substantially rigid. Changes in the size of the chip and of the substrate due to thermal expansion and contraction in service create substantial stresses in these rigid bonds, which in turn can lead to fatigue failure of the bonds. Moreover, it is difficult to test the semiconductor chip before attaching it to the substrate, and hence difficult to maintain the required outgoing quality level in the finished assembly, particularly where the assembly includes numerous semiconductor chips.

Numerous attempts have been made to solve the foregoing problem. Useful solutions are disclosed in commonly assigned U.S. Pat. Nos. 5,148,265 and 5,148,266. Preferred embodiments of the structures disclosed in these patents incorporate flexible, sheet-like structures referred to as "interposers" or "chip carriers." The preferred chip carriers have a plurality of terminals disposed on a flexible, sheet-like top layer. In use, the interposer is disposed on the front or contact bearing surface of the chip with the terminals facing upwardly, away from the chip. The terminals are then connected to the contacts of the chip. Most preferably, this connection is made by bonding prefabricated leads on the interposer to the contacts on the semiconductor chip, using a tool engaged with the lead. The completed assembly is then connected to a substrate, as by bonding the terminals of the chip carrier to the substrate. Because the leads and the dielectric layer of the chip carrier are flexible, the terminals on the chip carrier can move relative to the contacts on the semiconductor chip without imposing significant stresses on the bonds between the leads and the contacts on the semiconductor chip, or on the bonds between the terminals of the chip carrier and the substrate. Thus, the assembly can compensate for thermal effects. Moreover, the assembly most preferably includes a compliant layer disposed between the terminals on the chip carrier and the face of the semiconductor chip itself as, for example, an elastomeric layer incorporated in the chip carrier and disposed between the dielectric layer of the chip carrier and the semiconductor chip. Such a compliant structure permits displacement of the individual terminals independently towards the chip, and also facilitates movement of the terminals relative to the chip in directions parallel to the chip surface. The compliant structure further enhances the resistance of the assembly to thermal stresses during use, and facilitates engagement between the subassembly and a test fixture during manufacture. Thus, a test fixture incorporating numerous electrical contacts can be engaged with all of the terminals in the subassembly despite minor variations in the height of the terminals. The subassembly can be tested before it is bonded to a substrate so as to provide a tested, known, good part to the substrate assembly operation. This, in turn, provides very substantial economic and quality advantages.

U.S. Pat. No. 5,455,390, the disclosure of which is hereby incorporated in its entirety herein, describes a further improvement. Components according to preferred embodiments of the '390 patent use a flexible, dielectric top sheet. A plurality of terminals are mounted on the top sheet. A support layer is disposed underneath the top sheet, the support layer having a bottom surface remote from the top sheet. A plurality of electrically conductive, elongated leads are connected to the terminals on the top sheet and extend generally side by side downwardly from the terminals through the support layer. Each lead has a lower end at the bottom surface of the support layer. The lower ends of the leads have conductive bonding materials such as, for example, eutectic bonding metals. The support layer surrounds and supports the leads.

Components of this type can be connected to microelectronic elements such as semiconductor chips or wafers by juxtaposing the bottom surface of the support layer with the contact-bearing surface of the semiconductor chip so as to bring the lower ends of the leads into engagement with the contacts on the chip, and then subjecting the assembly to elevated temperature and pressure conditions. All of the lower ends of the leads bond to the contacts on the semiconductor chip substantially simultaneously. The bonded leads connect the terminals of the top sheet with the contacts on the semiconductor chip. The support layer desirably is either formed from a relatively low-modulus, compliant material, or else is removed and replaced after the lead bonding step with such a compliant material. In the finished assembly, the terminals on the relatively flexible dielectric top sheet desirably are movable with respect to the contacts on the semiconductor chip to permit testing and to compensate for thermal effects. However, the components and methods of the '390 patent provide further advantages, including the ability to make all of the bonds to the chip or other component in a single lamination-like process step.

U.S. Pat. No. 5,518,964, the disclosure of which is hereby incorporated by reference herein, discloses still further improvements. Preferred methods according to the '964 Patent include the steps of providing a dielectric connection component or first element having a plurality of terminals, a first surface and a plurality of elongated, flexible leads extending along the first surface, each such lead having a terminal end attached to one of the terminals and a tip end offset from the terminal end in a generally horizontal direction parallel to the first surface. Desirably, the tip ends of all the leads are attached to an associated one of the contacts on a second element, such as a microelectronic device. The preferred methods also include the step of simultaneously forming all of the leads by moving all of the tip ends of the leads relative to the terminal ends thereof and relative to the first element so as to bend the tip ends away from the first element. Desirably the step of moving the tip ends of the respective leads relative to their terminal ends includes the step of moving the second element relative to the first element. The first and second elements desirably move in a vertical direction, away from one another, and may also move in horizontal directions parallel to the surfaces of the elements so as to bend the tip end of each lead horizontally towards its own terminal end and vertically away from the terminal end. The net effect is to deform the leads towards formed positions in which the leads extend generally vertically downwardly, away from the first element. These methods may also include the step of injecting a flowable, desirably compliant dielectric material around the leads after the lead-forming step and then curing the flowable material so as to form a dielectric support layer around the leads.

In particularly preferred methods according to the '964 Patent application, one element is a flexible, dielectric top sheet having terminal structures thereon, and the other element includes one or more semiconductor chips. The resulting assembly thus includes the dielectric top sheet with the terminal structures connected to the associated contacts of the semiconductor chip or chips by the vertically-extending, curved flexible leads, the dielectric top sheet being spaced apart from the semiconductor chip or chips by the dielectric support layer. The terminal structures can be connected to a substrate such as a circuit panel to thereby provide electrical current communication to the contacts on the semiconductor chip or chips. Each terminal structure on the dielectric top sheet is movable with respect to the contacts in the semiconductor chip in horizontal directions parallel to the chip, as well as in vertical directions towards and away from the chip, to take up differences in thermal expansion between the chip and substrate and to facilitate testing and assembly.

The step of attaching the tip ends of the leads to the second element desirably includes the step of bonding the tip ends of the leads to the contacts on the semiconductor chip or chips while the leads are in their initial, undeformed positions. For example, a dielectric sheet having the leads disposed in generally horizontal orientation on its bottom surface may be juxtaposed with a chip or wafer so that the tip ends of the leads are engaged with the contacts of the chip or wafer. Thus, all of the tip ends are bonded simultaneously to the chip contacts. A single simultaneous bonding operation may bond hundreds or thousands of leads. Because the leads are in their initial, undeformed positions when bonded to the contacts, the positions of the lead tips are well controlled at this stage. Preferably, the tip ends of the leads are releasably bonded to the dielectric top sheet. This facilitates registration of the lead tips contacts on the semiconductor chips. As the top sheet is moved upwardly away from the chip or wafer, the tip ends of the leads are released from the top sheet. The '964 Patent also discloses other processes, including processes in which the leads are initially attached to the chip or wafer, and wherein the chip or wafer is engaged with dielectric sheet or other element having contacts thereon and the tip ends of the leads are bonded to the contacts. Although the teachings of the '964 Patent can be applied in manufacture of many different products, one product taught in the '964 Patent is a so-called "chip size package". The finished assembly, with the top sheet, terminals and compliant dielectric support layer, can be mounted within an area of a substrate substantially the same as that required to mount the chip itself.

A sheet-like elastomeric interposer having wires extending therethrough is disclosed in U.S. Pat. No. 5,531,022. The wires extend from a top surface to a bottom surface of the interposer. Balls on the ends of the wires are exposed at the top and bottom surfaces of the interposer for connecting to microelectronic elements. The wires may extend diagonally within the interposer and protuberances may project from the balls; those features are said to promote wiping between the balls and mating terminals.

Despite these and other advances in the art, there are still needs for further improvement.

SUMMARY OF THE INVENTION

One aspect of the present invention provides a component for forming connections to a microelectronic element. The component includes a compliant, sheet-like body having oppositely facing top and bottom surfaces. The top and bottom surfaces define outside surfaces of the connection component. As used herein, the term "sheet-like" means having a thickness much smaller than a length or a width. Thus, the compliant, sheet-like body has a thickness between its top and bottom surfaces that is substantially smaller than the length and width of the body.

The component according to the invention has a plurality of electrically conductive, sheet-like first pads directly attached to the body at the top surface, and a plurality of electrically conductive, sheet-like second pads directly attached to the body at the bottom surface. A plurality of flexible, electrically conductive, elongated leads interconnect the first conductive pads with corresponding second conductive pads. The leads extend between the bonding pads through the compliant body and thereby electrically connect the corresponding first and second conductive pads. The compliant body surrounds and supports the leads.

The leads of the connection component of the invention may be bent or curved, and may include wires interconnecting the first and second bonding pads. The wires may be bonded to at least one of the first and second bonding pads with a conductive epoxy. The wires may be between about 100 and 1,000 microns long and between about 25 and 100 microns in diameter.

The compliant, sheet-like body may be an elastomeric layer. The bonding pads may be gold; the leads may also be gold. In the preferred embodiment of the invention, only one lead interconnects each set of corresponding first and second conductive pads.

The top surface of the compliant layer may include raised portions surrounding the first pads. The bottom surface may have a plurality of recesses corresponding in location to the location of the raised portions on the top surface. Further, the compliant layer may define a plurality of holes extending substantially from the top to the bottom surfaces. The holes extend in regions of the compliant layer between the leads. The raised portions, recesses and holes further increase the compliancy of the compliant layer by providing empty spaces into which the compliant layer may deform.

The connection component of the invention provides a compliant means for connecting microelectronic components. The compliance of the connector absorbs relative movement between the components caused by mechanical or thermal effects. Further, the compliance compensates for nonplanarity of mating terminal arrays by permitting individual contacts to move relative to each other. The component presents flat, sheet-like bonding pads on the surfaces of the compliant body, permitting the forming of high-quality bonds, and increasing the tolerance of the connection component to positional errors in the terminals of the mating microelectronic components.

A further aspect of the invention provides a method for making a microelectronic connector. A method according to this aspect of the invention includes providing a first base sheet having a first major surface with a plurality of first conductive terminal portions. The terminal portions of the base sheet may be integral portions of the base sheet itself, may be conductive pads formed on a surface of the base sheet, or may be combinations of both. A plurality of leads is formed on the base sheet, with first ends of the leads connected to corresponding ones of the first conductive terminal portions, and second ends of the leads remote from the corresponding first base sheet. A compliant layer is then formed adjacent the first major surface of the base sheet. The compliant layer surrounds the leads, and has a first major surface abutting the first major surface of the base sheet. Surplus portions of the first base sheet are then removed, leaving the first terminal portions affixed to the compliant layer at the first major surface of the compliant layer.

Desirably, the first conductive terminal portions of the base sheet are conductive pads on the first major surface of the base sheet. The conductive pads are formed from material having a greater resistance to a selected etchant than the base sheet. The step of removing a portion of the base sheet comprises etching the base sheet with the selected etchant so as to leave the conductive pads substantially intact on the first major surface of the compliant layer. In that case, the step of forming the leads may comprise connecting the first ends of the leads to the conductive pads.

The conductive first terminal portions may alternatively be integral portions of the base sheet. In that case, the step of removing surplus portions of the base sheet comprises selectively removing portions of the base sheet outside the terminal portions. In this embodiment, the terminal portions of the base sheet may further comprise conductive pads formed on a back surface opposite the first major surface of the base sheet.

Most preferably, the first ends of the leads are displaced with respect to the second ends of the leads, deforming the leads. By forming bends or curves in the leads, the leads are permitted to extend slightly in use, thereby allowing relative expansion, contraction and movement of two microelectronic elements joined by the connector. Deformation of the leads thus creates "slack" in the leads to permit later relative movement.

Desirably, the method of the invention further includes the steps of providing a second base sheet having a second major surface and including a plurality of second conductive terminal portions, and bonding the second ends of the leads to corresponding ones of the second terminal portions. The compliant layer is thus formed between the first and second base sheets, and the step of forming the compliant layer includes forming a second major surface of the compliant layer abutting the second major surface of the second base sheet. In this case, the removing step further comprises removing portions of the second base sheet, whereby the second terminal portions remain affixed to the compliant layer at the second major surface.

The above-described method may be performed using a lead forming tool to form the plurality of leads substantially simultaneously. The lead forming tool has a tool surface facing the first major surface of the first base sheet. After forming the leads on the first base sheet, the lead forming tool is separated from the first base sheet so that the lead wires pay out from the lead forming tool. The compliant layer is then formed between the tool and the base sheet so as to form a second major surface of the compliant layer abutting the tool surface of the lead forming tool.

The method may also include the step of forming asperities on the first terminal portions of the base sheet. The asperities aid in breaking through any oxide layers present on the mating terminals of a microelectronic element, or on the finished terminal portions of the connector of the invention. The asperities may be formed by forming an etch-resistant pattern on back surfaces of the terminal portions, so that a pattern including asperities is formed on the terminal portions as the base sheet is etched.

The method may additionally include the step of etching the first major surface of the base sheet in regions surrounding the first conductive terminal portions. The etching step forms recessed portions of the base sheet surrounding the terminal portions. In this embodiment, the step of forming the compliant layer forms raised portions of the compliant layer abutting the recessed portions of the base sheet and surrounding the first terminal portions. The method may further comprise the step of forming holes in the compliant layer extending substantially from the first major surface to the second major surface.

According to a further, and particularly preferred method of the invention, a microelectronic connector is made by providing a first sacrificial base sheet with a first major surface. The first major surface has a plurality of first conductive terminals disposed thereon. A plurality of leads extending away from the base sheet is then formed. The leads have first ends connected to corresponding ones of the first conductive terminals, and have second ends remote from those terminals.

A second sacrificial base sheet is then provided having a second major surface. The second base sheet has a plurality of second conductive terminals disposed on the second major surface. The second ends of the leads are bonded to corresponding ones of the second terminals, electrically connecting the first and second conductive terminals through the leads. A compliant material is then injected between the first and second major surfaces to form a compliant layer substantially surrounding the leads. The compliant layer has first and second major surfaces abutting the first and second sacrificial base sheets, respectively. The first and second sacrificial base sheets are then removed, leaving the first and second terminals affixed to the compliant layer at the first and second major surfaces, respectively.

The base sheets may be removed by etching them with an etchant that does not dissolve the terminals, thus leaving the terminals affixed to the compliant layer. In that case, the base sheets are provided with terminals that are resistant to the etchant used to dissolve the base sheets.

The step of bonding the second ends of the leads to the second terminals may include applying a conductive epoxy on the second ends of the leads or on the second terminals, joining the leads and terminals, and curing the epoxy.

According to a particularly preferred variant of this approach, the step of forming the leads includes bonding an end of a wire to one of the first terminals, severing the wire at a pre-determined distance from the first terminal, and repeating the forming and severing steps for each of the first terminals. The wires may be severed using a flame, which forms an enlarged end on the remaining wire suitable for bonding during a subsequent bonding operation, and an enlarged end on the formed lead suitable for bonding to a second terminal.

The method preferably includes the step of displacing the first and second sacrificial base sheets toward each other, thereby deforming the leads. The deformed leads provide resilience to the microelectronic connector, permitting relative movement between the ends of the leads in all directions.

In another method according to the invention, a lead bonding tool is used to form the leads. The lead bonding tool has a tool surface, a pattern of holes opening on the tool surface at locations corresponding to locations of first terminal portions of a first base sheet, and a plurality of lead wires having first ends protruding from the holes. The lead wires may be fed through the holes from a lead wire supply such as a coil. The base sheet and the lead bonding tool are brought together so as to bring the first ends of the lead wires into proximity with the terminal portions of the base sheet. The first ends of the lead wires are then bonded to the terminal portions using thermosonic bonding or other techniques.

The lead bonding tool is then moved away from the sacrificial base sheet so that the lead wires pay out from the lead bonding tool. A flowable material is then injected between the tool surface of the bonding tool and the first major surface of the base sheet to form a compliant layer that substantially surrounds the lead wires. The compliant layer has a first major surface abutting the first major surface of the base sheet, and a second major surface abutting the surface of the bonding tool. The bonding tool is then moved away from the compliant layer so that the lead wires pay out additionally from the lead bonding tool. In this step, the tool surface of the bonding tool is separated from the second major surface of the compliant layer.

The lead wires are then severed at or above the second major surface of the compliant layer, to form leads extending through the compliant layer. Surplus portions of the first sacrificial base sheet are then removed, leaving the first terminal portions affixed to the compliant layer at the first major surface of the compliant layer.

Preferably, the surplus portions of the first sacrificial base sheet are removed by etching. The etching agent dissolves the surplus portions of the first sacrificial base sheet while leaving the first conductive terminal portions substantially intact. The method may also include the step of bending the lead wires before they are severed.

In a most preferred version of this method, the step of severing the lead wires forms second ends of the leads extending from the second major surface of the compliant layer. The second ends of the leads are then etched to a point substantially flush with the second major surface of the compliant layer. A second sacrificial base sheet having a second major surface and a plurality of second conductive terminals disposed on the second major surface is then bonded to the connector. Specifically, the second ends of the leads are bonded to corresponding ones of the second terminals. The second sacrificial base sheet is then removed, leaving the second terminals affixed to the second major surface of the compliant layer.

The second ends of the leads may be bonded to corresponding second terminals using a conductive epoxy. Further, the step of severing the lead wires may comprise severing the wires with heat such as a flame so as to form enlarged ends of the leads. The enlarged ends protrude from the holes in the bonding tool.

The step of severing the lead wires may comprise severing the leads at a distance from the bonding tool sufficiently small to maintain substantial control of locations of the first ends of the lead wires during a subsequent lead wire bonding step. Thus, the lead wires extending from the bonding tool after the process is complete are ready for a subsequent performance of the steps of the process.

In another method of the invention, a first sacrificial base sheet is provided with first conductive terminals exposed on a first surface thereof. The base sheet further comprises recesses on the first major surface surrounding the first conductive terminals. A plurality of leads is then formed on the first conductive terminals, with first ends of the leads connected to the first terminals and second ends remote from the first base sheet. A compliant layer is then formed substantially surrounding the leads. The compliant layer has a first major surface abutting the first major surface of the first base sheet. The first sacrificial base sheet is then removed, exposing the first major surface of the compliant layer. The first conductive terminals remain affixed to the compliant layer on the first major surface of the compliant layer. The first major surface of the compliant layer has raised portions formed by the recesses in the sacrificial base sheet. The raised portions substantially surround the terminals.

The method may further include providing a facing element having a second major surface facing the first major surface of the sacrificial base sheet. The sacrificial base sheet and the facing element form a gap between their respective surfaces. The second major surface of the facing element has raised portions in locations corresponding to the recesses in the first major surface of the sacrificial base sheet. The compliant layer is formed by injecting a compliant material into the gap. The compliant layer then has a second major surface abutting the second major surface of the facing element and having recesses formed by the raised portions of the facing element. The recesses and the raised portions formed on the compliant layer increase the compliancy thereof.

The facing element may be a second sacrificial base sheet having a plurality of second conductive terminals on the second major surface between the raised portions. In this case, the method further includes the step of bonding the second ends of the leads to corresponding ones of the second terminals.

The facing element may alternatively be a lead bonding tool having a plurality of holes opening on the second major surface. A plurality of the lead wires in the bonding tool have first ends protruding from the holes. In this embodiment, the step of forming the leads also includes approaching the sacrificial base sheet with the lead bonding tool so as to bring the first ends of the lead wires into proximity with the first conductive terminals, bonding the first ends of the lead wires to the terminals, and moving the lead bonding tool away from the first sacrificial base sheet so that the lead wires pay out from the lead bonding tool. After the compliant layer is formed, the lead bonding tool is moved away from the compliant layer so that the lead wires pay out from the lead bonding tool. The leads are then severed at or above the second major surface of the compliant layer to form the leads.

This version of the method of the invention may also include the step of forming holes in the compliant layer extending substantially from the first major surface to the second major surface. The holes increase the compliancy of the compliant layer. The method may also include the step of etching the first major surface of the first base sheet around the conductive terminals so as to form the recesses in the base sheet.

These and other objects, features and advantages of the present invention will become more readily apparent from the detailed description of the preferred embodiment set forth below, taken in conjunction with the accompanying drawings.

DETAILED DESCRIPTION OF THE PREFERRED EMBODIMENTS

Figure 1:
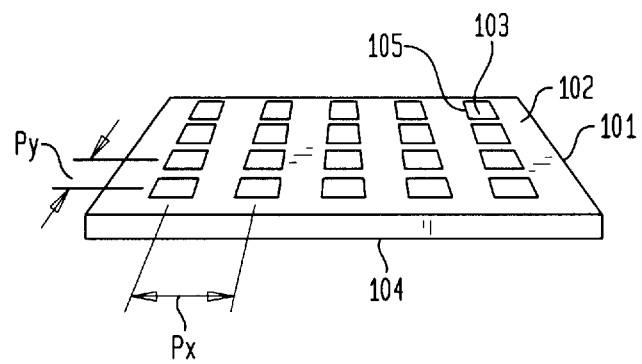
FIG. 1 is a schematic perspective view of a base sheet including a plurality of conductive terminals used in the manufacture of a component according to one embodiment of the invention.

A process for manufacturing components according to one embodiment of the invention begins with a starting first base sheet 101, shown in FIG. 1. The first base sheet 101 is formed of a conductive material that may be dissolved in an etchant. Examples of base sheet materials include copper, aluminum and tin. The base sheet is preferably between about 10 and about 100 microns in thickness, and is more preferably between about 10 and about 30 microns thick. A supporting tool (not shown) having a flat surface may be used to support the back surface 104 of the base sheet 101 during subsequent operations.

The first base sheet includes a plurality of conductive terminal portions 105. In the embodiment shown in FIG. 1, the conductive terminal portions 105 of the base sheet 101 comprise conductive pads 103 formed on the first major surface 102. The conductive pads 103 are formed by electroplating with an etch resistant metal such as a metal selected from the group consisting of nickel, gold and palladium, most preferably gold. This plating may be from about 2 to about 50 microns thick, and is most preferably about 25 microns thick. The metal forming the conductive pads 103 is selected so as to be resistant to an etchant capable of dissolving the base sheet 101, such as sulfuric acid.

The pattern of bond pads 103 on the base sheet 101 may be formed using conventional photolithographic techniques including applying an electrophoretic resist, selectively exposing the areas around the bond pads by the resist, heat curing and developing the resist to remove uncured resist, plating the bond pads and removing the resist. The pattern of bond pads typically includes a vast number of terminal-forming regions, typically thousands or tens of thousands, arranged in a substantially regular pattern including one or more regular rectilinear grids having a constant pitch $P_x$ in one direction and a constant pitch $P_y$ in the other direction along the first primary surface 102 of the base sheet 101. In a preferred embodiment, the pitches $P_x$ and $P_y$ are equal, and are less than 1 mm. In a more preferred embodiment, the minimum pitch is less than 0.75 mm; in a most preferred embodiment, the pitch is about 0.5 mm or less. The bond pad pattern will ultimately be associated with individual chips, possibly in a wafer, and grids therefore correspond with standard terminal grids used in microelectronic chips.

Figure 2:
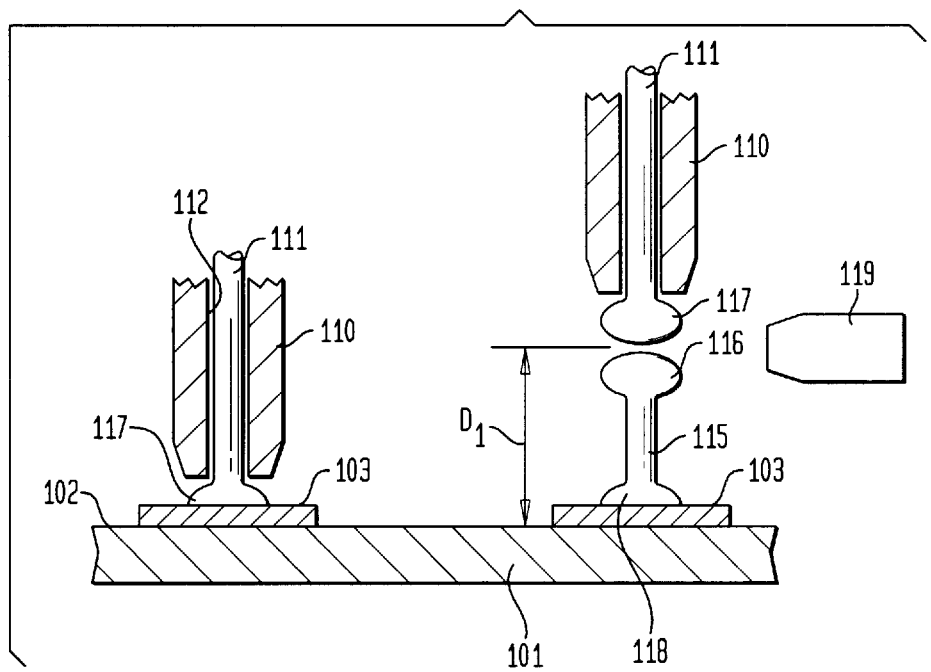
FIG. 2 is a partial schematic sectional view of a manufacturing step involving the elements shown in FIG. 1, according to a method of the invention.

In the next stage of the process, leads are connected to the conductive pads 103. As illustrated in FIG. 2, the lead forming process uses a tubular, needle-like wire bonding capillary 110 having an internal bore 112. A fine gold lead wire 111, less than about 100 microns, are preferably less than about 50 microns and desirably about 25 microns in diameter, extends through the bore 112 to the tip of capillary 110. Wire 111 has an integrally formed ball or bulbous portion 117 at its tip. Capillary 110 is aligned with the conductive pad 103 and advanced so as to engage ball 117 with pad 103. Heat, ultrasonic energy and pressure are then applied through capillary 110 so as to fuse ball 117 with pad 103, thereby forming an enlarged section in wire 111 adjacent to pad 103 and permanently joining the wire to the pad. This fusing process is commonly referred as "thermosonic bonding." As illustrated in the right-hand portion of FIG. 2, the capillary 110 is then retracted away from the base sheet 101 and away from the pad 103, paying out wire 111 and forming an elongated lead 115 extending away from the pad 103. Heat is then applied at a pre-selected location along the wire 111, at a predetermined distance $D_1$ from the base sheet 101, so as to sever the wire. The new lead 115 has a first end 118 attached to the pad 103 and a second end 116 remote from the base sheet 101. The heat may be applied by a hot gas source or nozzle 119, by a small flame, by an electric arc or by any other source capable of heating the wire at the pre-selected location. This process, commonly referred to as "flaming off," forms an enlarged section or ball at the second end 116 of the lead 115 remote from the associated pad 103 and remote from the base sheet 101. The same process forms another enlarged section or ball 117 on the end of wire 111, so that the process can be repeated. Although only two terminals and two leads 115 are shown being formed in FIG. 2, the actual process involves formation of similar leads on all the pads 103. Moreover, although capillary 110 is illustrated as dispensing only a single wire 111 so as to form only a single lead 115, the capillary may include numerous holes to dispense a plurality of wires simultaneously, and to bond those wires simultaneously to an entire row or array of pads. Also, numerous capillaries may operate simultaneously.

Figure 3:
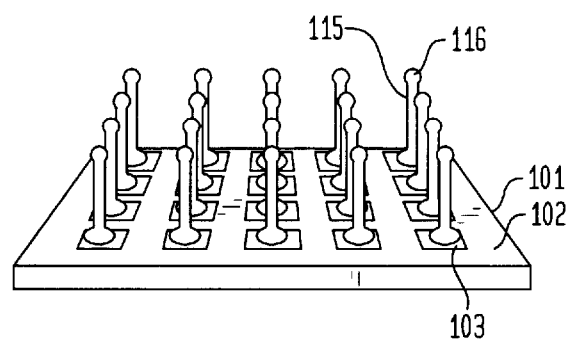
FIGS. 3–5 are further schematic perspective views similar to those of FIG. 1 but at progressively later stages during manufacture.

Following the lead formation process, the base sheet 101 has an array or "forest" of leads 115 protruding away from the base sheet 101 (FIG. 3). Each of the leads has an enlarged portion at the second end 116 of the lead remote from the sheet 101.

Figure 4:
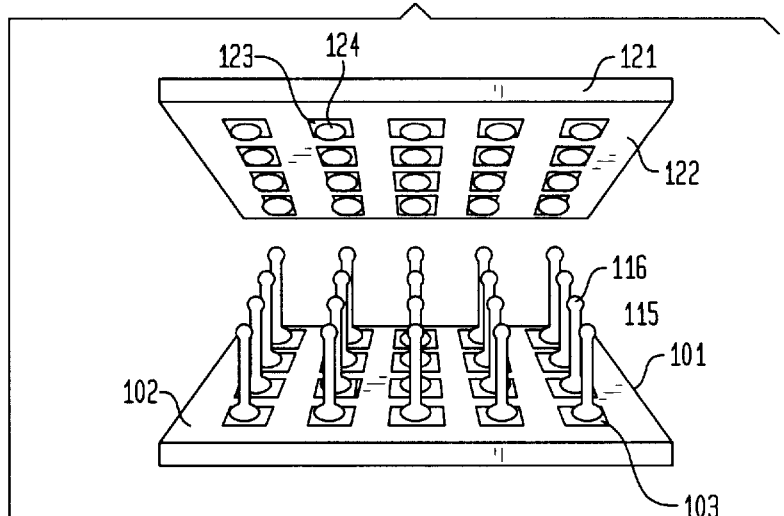

A second base sheet 121 (FIG. 4) having a second major surface 122 is next provided. The second base sheet may be similar to the first base sheet 101 in material and dimensions and may be supported by a flat platen during the described assembly operations. The second base sheet 121 has a second plurality of conductive pads 123 formed on the second major surface 122. The conductive pads 123 correspond in spacing to the conductive pads 103 of the first base sheet, and correspond in location to the second ends 116 of the leads 115. In a preferred embodiment, a conductive epoxy 124 is screen printed or otherwise applied on the second bond pads 123. The first base sheet 101 and second base sheet 121 are then placed in registration to align the second ends 116 of the leads 115 with the bond pads 123, and the two base sheets are brought together so that the leads 115 contact the conductive epoxy 124. The conductive epoxy 124 is then cured chemically or thermally, as required.

The second ends 116 of the leads 115 may alternatively be bonded to the bond pads or the conductive pads 123 by other means, such as by using a bonding metal (not shown). In that embodiment, a layer of bonding metal is applied to the second end 116 of each lead 115. The bonding metal is a metal arranged to form a liquid metallic phase at a relatively low bonding metal activation temperature and to solidify into a secure bond with the metal of the lead 115 and with the metallic conductive pads 123 on the second base sheet 121. Where the leads 115 are gold or a gold alloy, the bonding metal preferably is selected from the group consisting of tin, alloys of gold with tin, or with germanium, or with silicon or with combinations of these metals, and more preferably is selected from the group consisting of alloys of gold and tin. The bonding metal may be deposited by plating on tips on second ends 116. To inhibit oxidation of the bonding metal, a further thin layer (not shown) of gold may be applied by further plating over the bonding metal.

Figure 5:
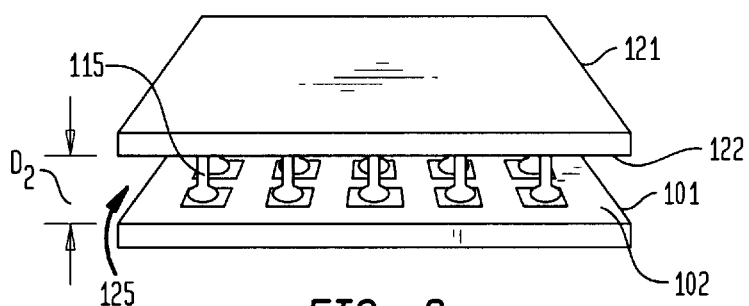

Base sheet 101 and base sheet 121 at this point in the process are interconnected by the "forest" of leads 115 extending between the first surface 102 and second surface 122, as shown in FIG. 5. The first and second major surfaces 102, 122 are separated by a distance $D_2$. Surrounding the leads 115 between the first and second major surfaces 102, 122 is an open space 125.

Figure 6:
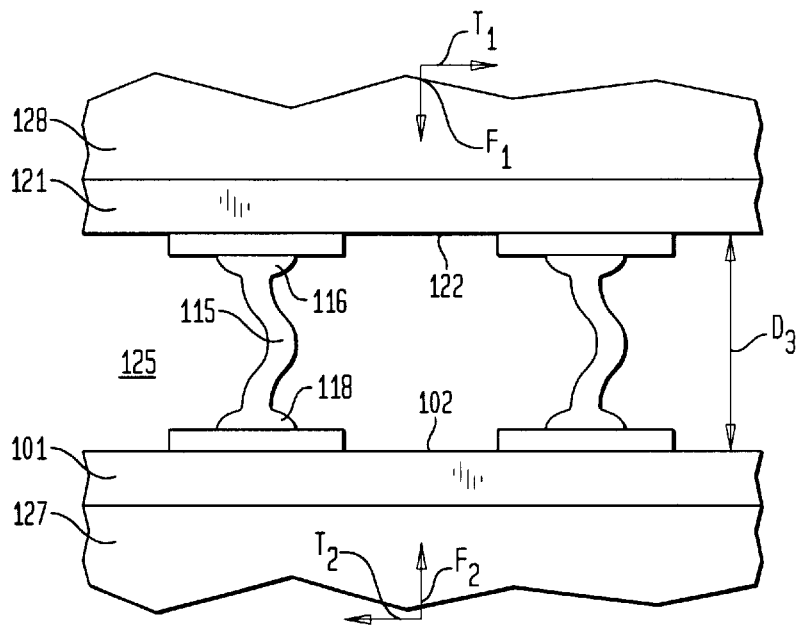
FIG. 6 is a partial side elevational view showing the elements of FIGS. 1–5 in a progressively later stage during manufacture.

The leads 115 are next bent or deformed to provide compliance in all directions between the first and second ends of the leads. One or both platens 127, 128 (FIG. 6) behind the base sheets 101, 121 is advanced in the direction of arrows $F_1$, $F_2$. The distance $D_2$ (FIG. 5) between the first major surface 102 and second major surface 122 of the base sheets is reduced to a distance $D_3$ (FIG. 6), buckling or deforming the leads 115. Preferably the advancing platens deform all of the leads at least partially in plastic deformation so that each lead takes a permanent set to the desired distance $D_3$. That is, the second ends 116 of the leads are brought into a common plane substantially parallel to the first surface 102 of the base sheet 101. This deformation desirably brings each lead to a slightly curved condition, as by bending or buckling the lead. As used in this disclosure, the term "curved" includes kinked or bent shapes, as well as arcuate and other smoothly curved shapes. The platens 127, 128 may furthermore be displaced in transverse directions such as directions $T_1$, $T_2$ with respect to each other, deforming the lead to form an overall diagonal shape (not shown).

The curved leads 115 provide "slack" to permit a displacement of the first and second ends 118, 116 of the leads away from each other. Further, the curves in the leads reduce the compressive forces required to displace the lead ends toward each other by overcoming initial column buckling forces.

Figure 7:
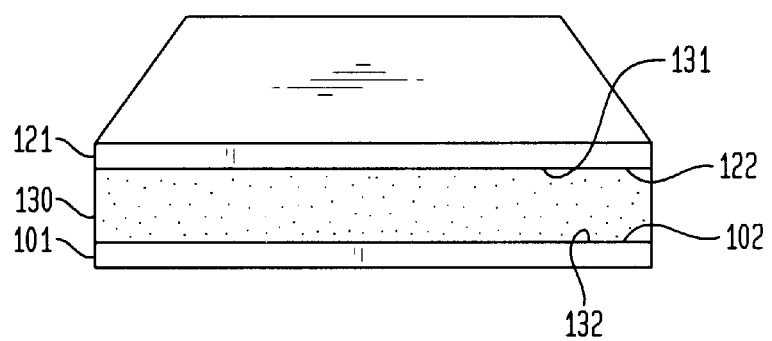
FIGS. 7 and 8 are schematic perspective views similar to those of FIGS. 3–5 but at progressively later stages during manufacture.

With the platens 127, 128 in their fully advanced condition, a flowable, curable dielectric material is injected into the space 125 between the base sheet 101 and the base sheet 121 to form a compliant layer 130 (FIG. 7). The flowable dielectric material surrounds the leads 115. Most preferably, the flowable material in its uncured condition has a very low viscosity and surface tension so that it effectively fills all of the spaces between all of the leads 115. The dielectric material is arranged to form an elastomer upon cure. Suitable materials include curable silicone such as that sold under the trademark Dow 577 Silicone by the Dow Corning Corporation of Midland, Mich., and other curable silicones available from Shin-Etsu Silicones of America, Inc. Preferably, one of the platens 127, 128 is provided with a raised edge portion (not shown) surrounding the edges of the space 125 (FIG. 6) between the first and second base sheets. The edge portions of the platens confine the flowable material to a pre-selected zone encompassing the array of leads.

While the base sheets and flowable material are held between the platens, the flowable material is cured to form an elastomeric, compliant support layer 130. Layer 130 has a first major surface 132 abutting the first major surface 102 of the first base sheet (FIG. 7), and a second major surface 131 abutting the second major surface 122 of the second base sheet 121. The thickness of the compliant layer 130 between its first and second major surfaces is about 100 to about 1000 microns, and preferably about 200 microns.

Figure 8:
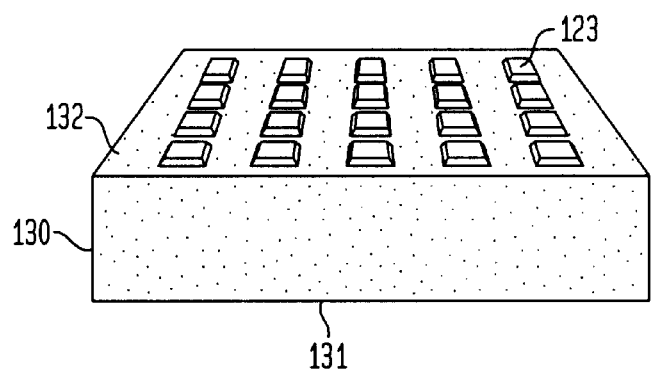

After the compliant layer 130 has been formed, the connector element, including base sheets 101, 121 and compliant layer 130, is removed from the platens and exposed to an etchant, such as sulfuric acid. The etchant dissolves the surplus base sheets 101, 121, while leaving the conductive pads 103, 123 on the first and second major surfaces 131, 132 of the compliant layer 130 (FIG. 8). The term "surplus" as used herein refers to that portion of an element that is removed during a fabrication process. In this case, substantially the entire base sheet except the conductive pads is surplus. The conductive pads 103, 123 remain after etching because the material used to form the conductive pads is resistant to the etchant used to remove the base sheets. The conductive pads are held in place on the compliant layer 130 by the bond between the conductive pads and the ends of the leads, and by the adhesive forces between the compliant layer 130 and the conductive pads. Each of the first conductive bond pads 102 is connected to a corresponding one of the second conductive pads 123 by a lead 115, which passes through the compliant layer 130.

Because the conductive pads are formed by a deposition or plating process, the conductive pads on the compliant layer remaining after removing the base sheets are sheet-like; i.e., they have a thickness much smaller than their dimensions parallel to the first and second surfaces 131, 132 of the compliant layer. The sheet-like conductive pads of FIGS. 1–7 are square, but may be formed in any other shape during the photolithographic process, such as rectangular, triangular or rounded. The sheet-like pads provide large areas in comparison to the pitch, for contact with terminals on mating microelectronic elements. The connection component of the invention is therefore inherently tolerant of locational errors within a terminal array of a mating element.

Figure 9:
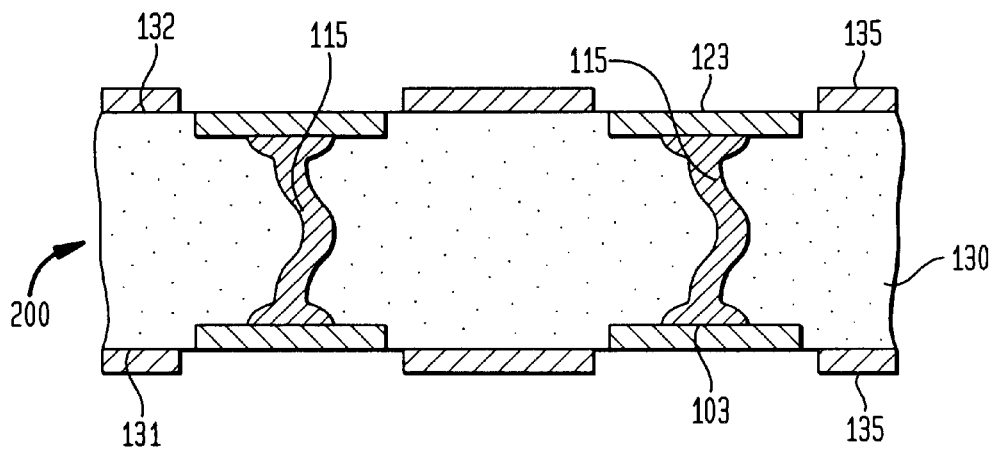
FIG. 9 is a schematic, partial sectional view of a completed component according to one embodiment of the invention.

A layer 135 of heat activable adhesive (FIG. 9) may be applied on the first and second major surfaces 131, 132 of the compliant layer 130 to form a finished connection component 200. Preferably, the adhesive is applied so as not to cover the conductive pads 103, 123. The adhesive is preferably arranged to remain solid and non-tacky at room temperature, but is arranged to form a flowable, liquid phase momentarily when raised to a pre-selected adhesive activation temperature and then form a solid bond. The adhesive activation temperature desirably is a temperature above room temperature, but below a temperature that would be damaging to the layers of the connection component or to the semiconductor structure which will be used with the connection component. Desirably, the adhesive activation temperature is between about 40° C. and 160° C. The thermosetting adhesives commonly referred to as "snap-cure" adhesives can be utilized. One suitable solvent-free snap-cure adhesive is sold under the trademark ABLE-BOND 967-3, marketed by the Ablestick Electronic Materials and Adhesives Company of Rancho Dominguez, Calif.

The uncured adhesive may be deposited on the major surfaces 131, 132 of the compliant layer 130 by dispersing or dissolving the adhesive ingredients in a volatile liquid vehicle. The resulting mixture is then deposited on the surfaces in the desired pattern by essentially any method of pattern-wise liquid deposition such as stenciling, silk-screening, gravure printing or by processes which employ photosensitive masking agents and pattern-wise illumination to form a stencil or mask for adhesive application. After the mixture has been deposited, the liquid vehicle is removed by evaporation, leaving a thin layer of uncured adhesive in the desired pattern.

Figure 10:
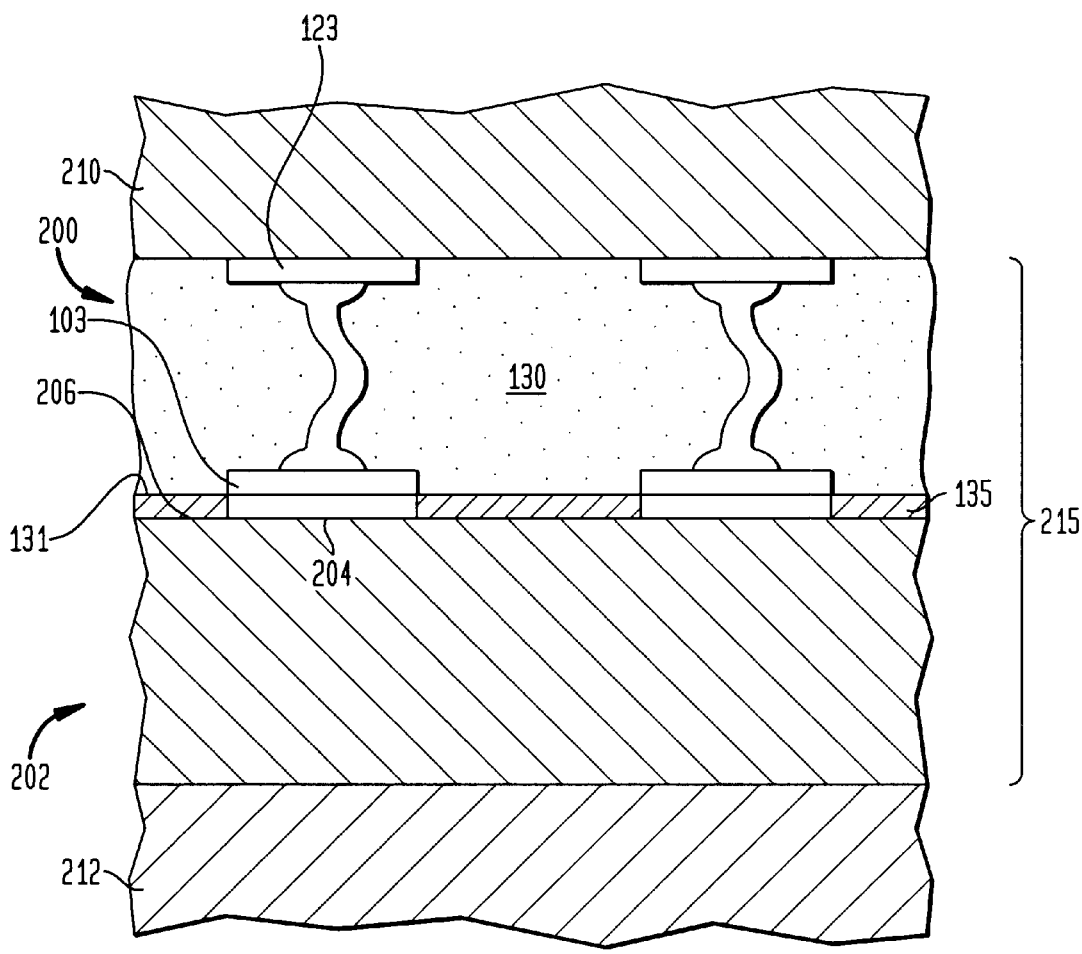
FIG. 10 is a schematic, partial sectional view depicting one method of forming a microelectronic assembly according to the invention.

Following the application of the adhesive, the component is ready for use. As illustrated in FIG. 10, the finished connection component 200 is placed adjacent a semiconductor chip or substrate 202 having terminals 204, so that the first major surface 131 of the compliant layer 130, and the adhesive layer 135, confront a top surface 206 of the chip or substrate. The conductive pads 103 of the connector component 200 confront the terminals 204 of the chip or substrate 202. Platens 210, 212 apply compressive forces between the connection component 200 and the substrate 202, assuring contact between surfaces of the adhesive 135 and the substrate 202, and between the conductive pads 103 and the terminals 204. The assembly is then heated to activate the adhesive 135, as well as to activate bonding material provided on one or both of the terminal 204 and the conductive pad 103. The bonding material may be a bonding metal or a conductive epoxy as described above. The resulting package 215 has conductive pads 123 electrically connected to each of the terminals 204 of the substrate or chip. Such a package may be mounted directly to another substrate. The compliant layer 130 compensates for thermally induced and mechanically induced forces within the assembly, and further compensates for planarity errors in the mating terminal array on the substrate.

In addition to its use as an interposer as shown in FIG. 10, the connection component 200 may also be used as a test socket for testing microelectronic components. The conductive pads 103, 123 provide relatively large areas for contact with the individual balls of a ball grid array or the terminals of other types of terminal arrays. The individual compliance of the conductive pads permits simultaneous contact of all the terminals in grid arrays with planarity errors.

Figure 11:
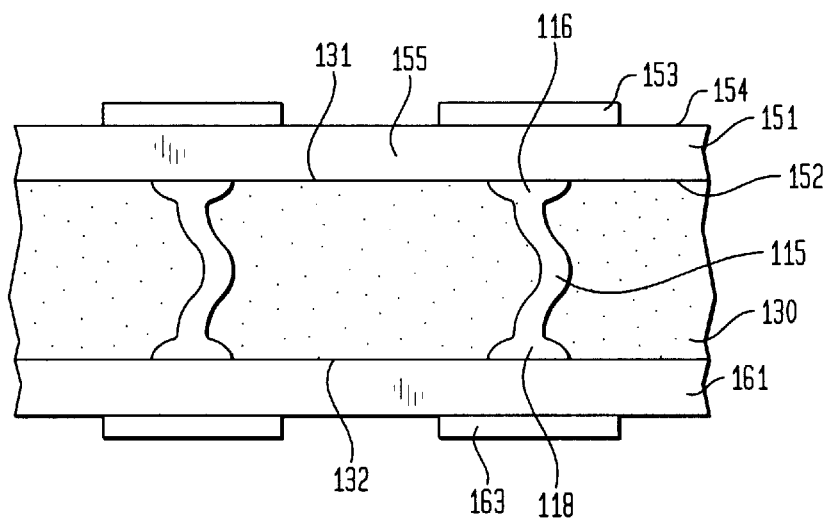
FIG. 11 is a schematic, partial sectional view depicting a stage in the manufacture of a microelectronic component according to one embodiment of the invention.

In another method according to the invention, conductive pads 153 (FIG. 11) are formed on the back surface 154 of a base sheet 151, in an area of the base sheet corresponding to terminal portions 155. The conductive pads 153, together with surrounding regions of the base sheet 151, comprise the terminal portions 155 of the base sheet. The conductive pads 153 are formed of a material that is more resistant to a selected etchant than is the base sheet 154. For example, the conductive pad 153 may be gold, while the base sheet is copper.

The leads 115 are bonded directly to the first major surface 152 of the base sheet 151 using conductive epoxy or a bonding metal as described above. Leads 115 are bonded to the base sheet at positions directly opposite conductive pads 153. A second base sheet 161 having second pads 163 may be bonded to the second ends 118 of the leads 115. The leads 115 are deformed, and a compliant layer 130 is formed between the base sheets 151, 161, as described above.

Figure 12:
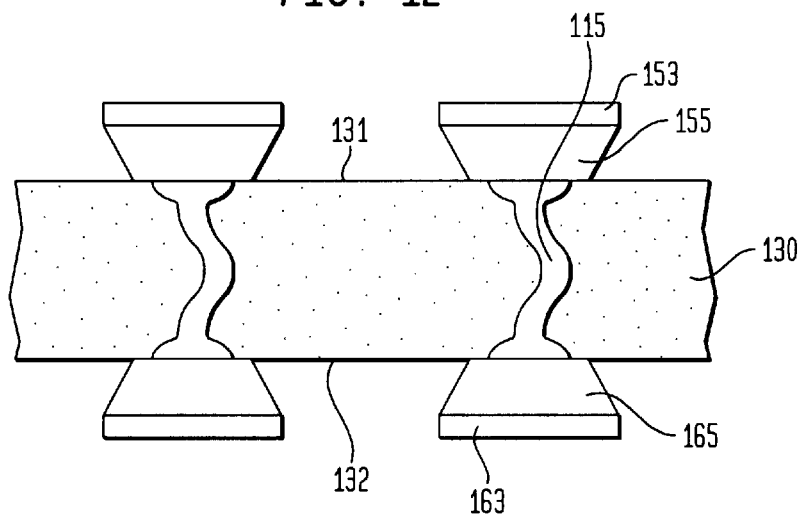
FIG. 12 is a schematic sectional view similar to FIG. 11 but at a progressively later stage in manufacture.

During the etching step, surplus portions of the base sheet surrounding the terminal portions 155 are etched isotropically around the conductive pads 153 (FIG. 12). Etching is continued until the surplus portions of the base sheet 151 are removed, leaving the terminals portions 155 attached to the first major surface 131 of the compliant layer 130. The conductive pads 153 remain on a side of the terminal portion 155 opposite the compliant layer 130. While the terminal portion 155 is undercut to some degree beneath the conductive pads 153, it is sufficiently extensive to support the conductive pad 153 during engagement with terminals of a mating microelectronic element.

The conductive pad 153 in the above process may be replaced by a removable photoresist pad that is resistant to the etching process. In that case, the terminal portion 155 is protected from the etchant, as above, by the photoresist. The photoresist is later removed, exposing a surface of the terminal portion of the base sheet for contact with a mating component terminal.

Figure 12A:
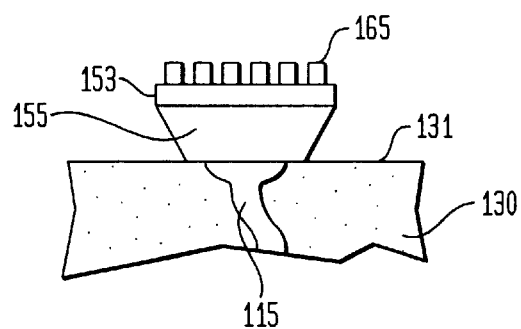
FIG. 12a is a fragmentary schematic sectional view of a terminal portion having asperities according to one embodiment of the invention.

Asperities such as asperity 165 (FIG. 12a) may be formed on the outer surface of the conductive pad 153 in order to enhance electrical contact with mating terminal pads. The asperities may be formed of a metal harder and/or more etch resistant than the conductive pad metal; for example, the asperities may be formed of a metal selected from the group consisting of gold, osmium, rhenium, platinum, palladium and alloys and combinations thereof. The asperities are formed on the conductive pads using known photolithographic techniques, and include sharp upper corners to scrape or wipe mating terminals on microelectronic elements. Scraping or wiping between the bond pads 153 of the invention and a mating terminal pad is enhanced by the curved configuration of the leads 115, which apply a reactive force at a skew angle to the top surface 131 of the compliant layer 130 and to the contact forces between the connector component and the microelectronic element.

Figure 13:
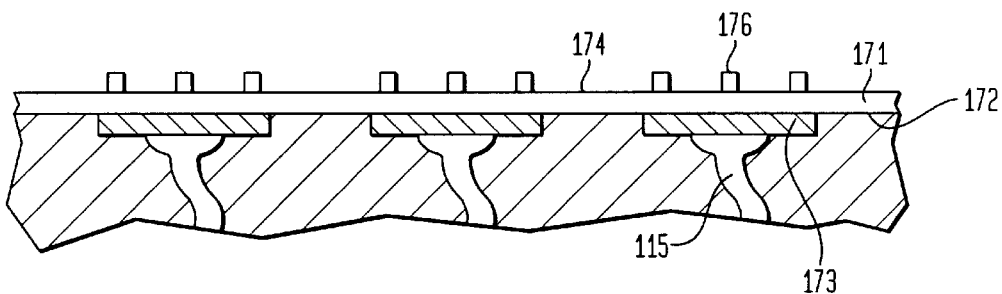
FIG. 13 is a partial schematic sectional view depicting a stage in the manufacture of a microelectronic component according to one embodiment of the invention.
Figure 14:
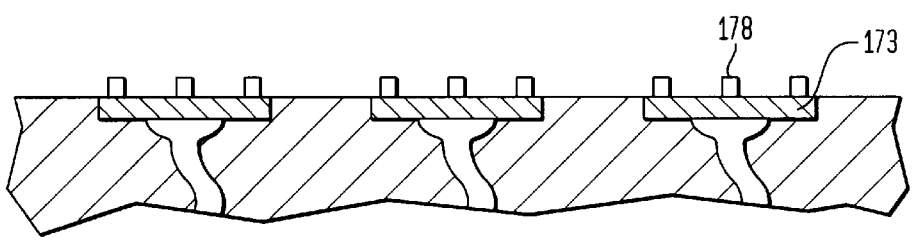
FIG. 14 is a partial schematic sectional view similar to FIG. 13 but at a progressively later stage in manufacture.

Asperities may be formed using other methods according to the invention. For example, in an embodiment wherein a first base sheet 171 (FIG. 13) has conductive pads 173 and wherein leads 115 are bonded directly to the conductive pads, etch-resistant photoresist dots 176 may be formed on the back surface 174 of the base sheet 171 before etching the base sheet. When the base sheet 171 is removed by etching, asperities 178 (FIG. 14) are formed in those regions of the base sheet 171 protected by the photoresist dots 176. Photoresist 176 is then removed, leaving the asperities affixed to the conductive pads 173.

Figure 15:
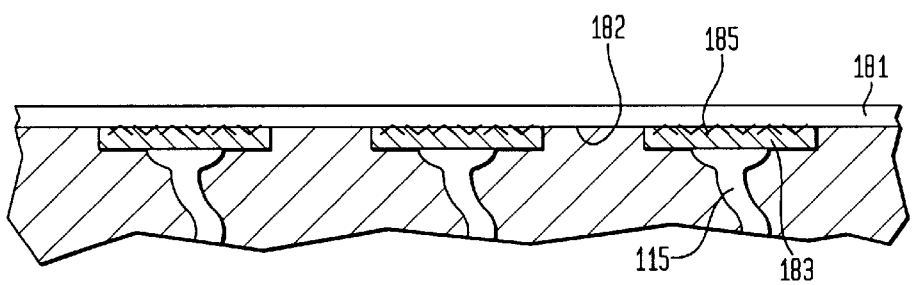
FIG. 15 is a partial schematic sectional view depicting a stage in the manufacture of a microelectronic component according to one embodiment of the invention.

In another method for forming asperities on conductive pads, hard, conductive, irregularly shaped bodies 185 (FIG. 15), such as particles of conductive diamond, are deposited on the base sheet 181 before the conductive pads 183 are formed. For example, conductive diamond particles may be embedded in the first major surface 182 of the base sheet 181 by coining or other means. The particles are preferably localized in the areas where the conductive pads 183 are formed. The conductive pads 183 are then formed over the irregularly shaped particles. When the base sheet 181 is etched away, the particles 185 remain as asperities projecting from the conductive pads 183.

Figure 16:
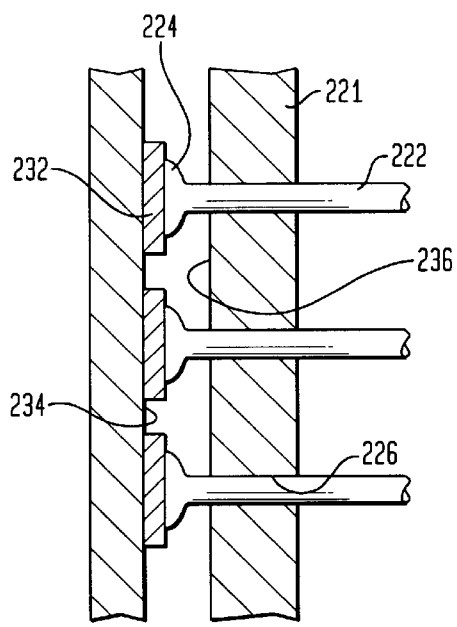
FIG. 16 is a partial schematic sectional view depicting a stage in the manufacture of a microelectronic component according to one embodiment of the invention.

In a method according to another embodiment of the invention, a lead bonding tool 221 (FIG. 16) has a plurality of holes 226 for receiving a plurality of lead wires 222. The holes 226 are arranged in an array corresponding to the array of leads to be formed in the finished connection component. Each of the lead wires 222 has an enlarged end 224 formed during a previous cycle of the bonding tool. The lead wires 222 remain threaded within the holes 226 of the lead bonding tool 221 from cycle to cycle, eliminating the necessity to rethread the wires. The enlarged ends 224 of the lead wires 222 are maintained at a location close to a tool surface 236 of the lead bonding tool 221, minimizing the length of the lead wire 222 extending from the holes 226 so that control of the locations of the enlarged ends 224 can be maintained with relative precision. Each of the lead wires 222 may be continuously fed from spools or other wire magazines contained within the lead bonding tool.

A base metal sheet 223 (FIG. 16) is approached by the lead bonding tool. The base sheet 223 has terminal portions such as conductive pads 232, located on a first major surface 234 of the base sheet. The enlarged portions 224 of lead wires 222 are brought into close proximity with the conductive pads 232 and then bonded to the pads using techniques described above such as thermosonic bonding, bonding using a conductive epoxy and bonding with an activable bonding metal. During the bonding operation, the position of the enlarged ends 224 may be precisely maintained with respect to the conductive pads 232 because of the short extension of bonding wire 222.

After the enlarged ends 224 have been bonded to the conductive pads 232, the bonding tool 221 is moved away from the base sheet 223. The lead wires 222 simultaneously pay out from the lead bonding tool 221 as the distance is increased between the base sheet 223 and the bonding tool 221.

Figure 20:
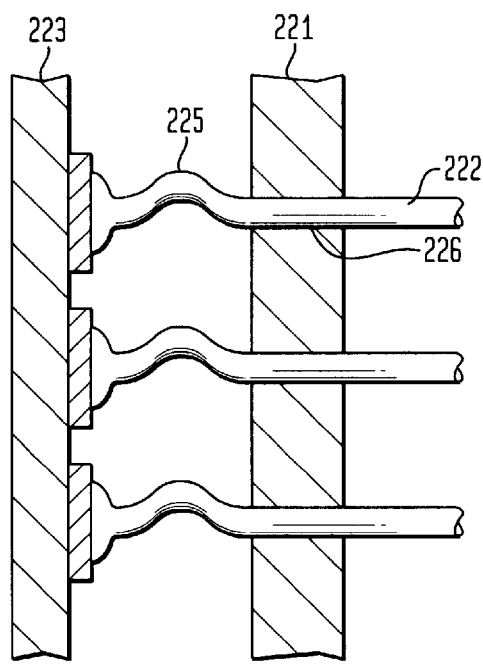
FIG. 20 is a schematic sectional view showing a step in a method for manufacturing a microelectronic component according to another embodiment of the invention.

The leads 222 may at this point be bent in order to provide additional compliance between ends of the finished leads. For example, as shown in FIG. 20, the lead bonding tool 221 may be displaced in a direction toward the base sheet 223 a short, pre-determined distance, while preventing the lead wires 222 from re-entering the lead bonding tool holes 226. The curves or bends 225 formed in the leads 222 permit relative movement of the ends of the leads, and reduce forces required for compressing the leads, as described above.

Figure 17:
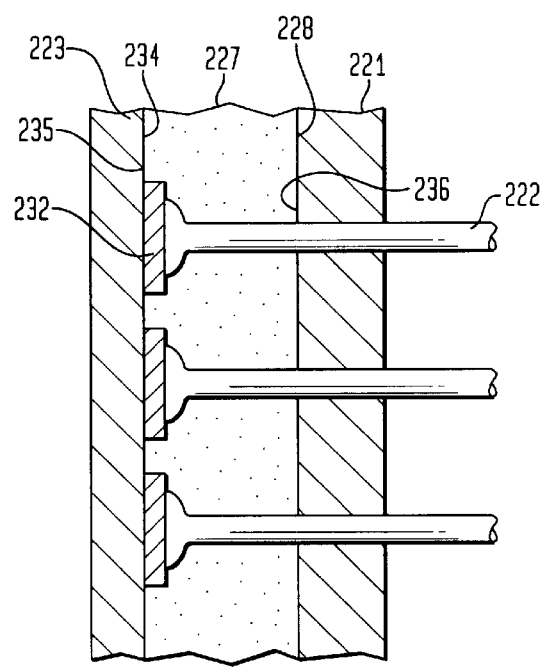
FIGS. 17–19 are further partial schematic sectional views similar to FIG. 16 but at progressively later stages in manufacture.
Figure 18:
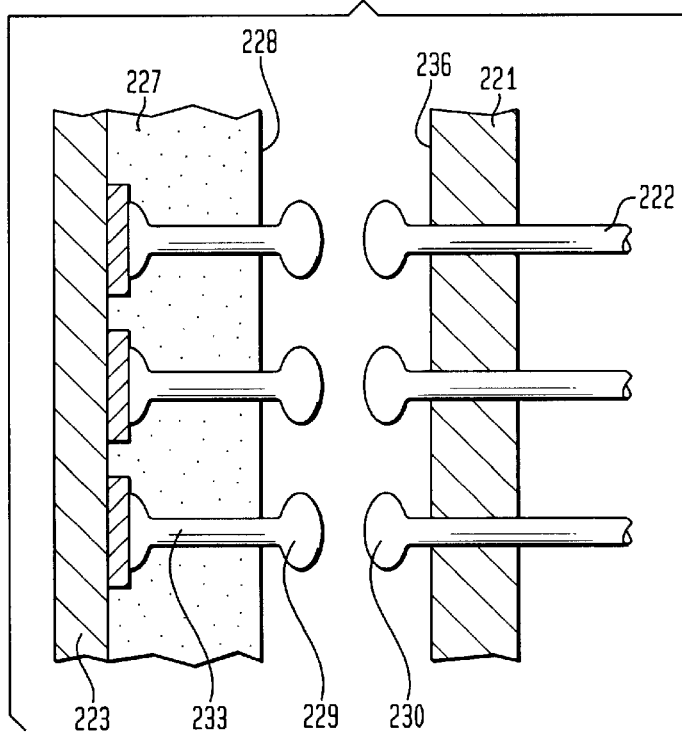

After the lead bonding tool 221 and the base sheet 223 are separated, a flowable material is injected into the space between the first major surface 234 of the base sheet 223 and the tool surface 236 of the lead bonding tool 221 (FIG. 17). The flowable material is one having a relatively low viscosity, but which may be cured to form compliant layer 227. The compliant layer 227 has a first major surface 235 abutting the first major surface 234 of the base sheet 223, and a second major surface 228 abutting the tool surface 236. After the compliant layer 227 has been cured, the lead bonding tool 221 is moved away from the compliant layer 227 exposing the second major surface 228 of the compliant layer. During such movement of the bonding tool, lead wires 222 pay out an additional amount to span the gap created between the compliant layer 227 and the bonding tool 221. The lead wires 222 are then flamed off in the gap (FIG. 18), forming an enlarged end 230 on the lead wire 222, and additionally forming leads 233 having exposed enlarged ends 229. The enlarged ends 230 on the remaining portions of the lead wires 222 have a shape suitable for bonding and are formed in a plane close to the tool surface 236 of the lead bonding tool 221 in order to maintain positional control of the enlarged ends 230 during the next lead bonding operation.

Figure 19:
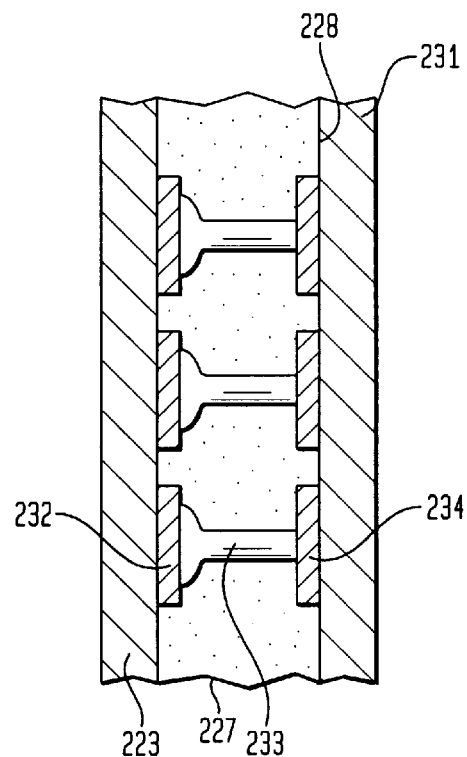

The newly formed leads 233 have irregularly shaped enlarged portions 229 protruding from the second major surface 228 of the compliant layer 227. Those ends are removed (FIG. 19) by etching the protruding portions of the leads 233 flush with the second major surface 228 of the compliant layer.

A second base metal layer 231 having terminal portions such as conductive pads 234 as next assembled onto the second major surface 228 of the compliant layer 227. The exposed ends of the leads 233 are bonded to the conductive pads 234 using a conductive epoxy or an activatable bonding metal as described above.

To complete the connector formed according to this process, the base sheets 223, 231 are etched from the surfaces of the compliant layer 227, exposing the conductive pads 232, 234, which are connected in pairs by leads 233 through the compliant layer 227.

Figure 21:
FIGS. 21–26 are partial schematic sectional views depicting successive stages in the manufacture of the microelectronic component according to one embodiment of the invention.
Figure 22:
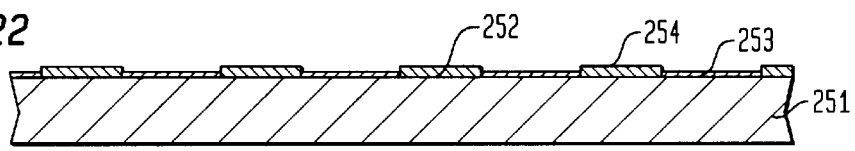

In an additional method according to the invention, the surfaces of the compliant layer are formed with recesses and/or raised portions to provide centering surfaces for mating contacts and to provide open regions into which the compliant layer may deform under compression. A sacrificial base sheet 251 (FIG. 21) is initially provided having a first major surface 252. As in the above-described embodiments of the invention, conductive terminal portions 253 (FIG. 22) are formed by first forming a photoresist pattern 254 on the first major surface 252 of the base sheet. The terminals pads 253 are deposited on the exposed areas of the first major surface 252, after which the photoresist pattern 254 is removed. The first base sheet 251 may be copper or another etchable material as described above, and the terminal pads 253 may be gold or another etch-resistant material.

Figure 23:
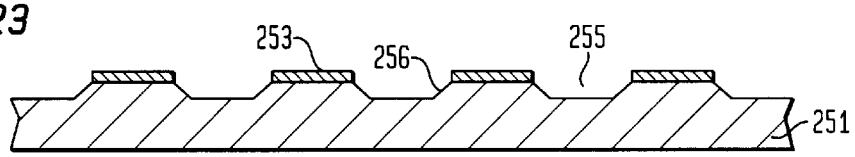

A material removal process (FIG. 23) is next performed on the first major surface 252 of the base sheet 251. In a preferred embodiment, the material removal process is an etching process that removes material from the base sheet 251 without significantly affecting the terminal pads 253. The material is removed isotropically, forming recesses 255 in regions of the first major surface surrounding the terminal pads 253. Sloped walls 256 are formed in the regions immediately surrounding the terminals pads 253 due to the isotropic nature of the process.

Figure 24:
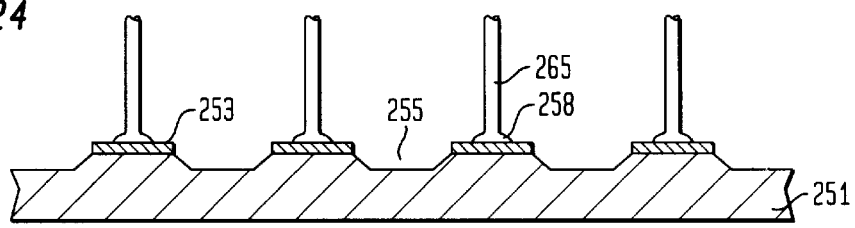

Leads 265 (FIG. 24) are next formed on the exposed surfaces of the terminal pads 253. The leads may be formed using any known lead-forming process including those described above. An enlarged first end 258 of the lead 265 is typically formed in the region where the lead is bonded to the terminal pad 253.

Figure 25:
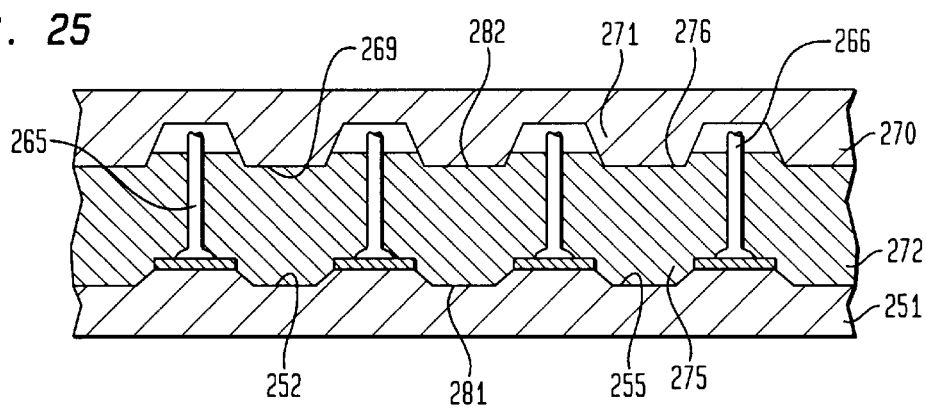

A compliant layer 272 (FIG. 25) is then formed on the first surface 252 of the base sheet 251, substantially surrounding the leads 265 as described in the above embodiments. The compliant layer 272 may be formed by pouring a flowable, uncured liquid compliant material onto the major surface 252 of the base sheet around the leads. Raised portions 275 of the compliant layer are formed by the recesses 255 in the base sheet 251.

A facing element 270 is next provided having a first major surface 269 facing the first major surface 252 of the first sacrificial base sheet 251. The facing element 270 has raised portions 271 in locations corresponding to the recesses 255 of the first sacrificial base sheet 251.

The facing element 270 is then advanced toward the base sheet 251 until the raised portions 271 on the first surface 269 of the facing element 270 form recesses 276 on a second major surface 280 of the compliant layer 272. The facing element 270 may have clearance areas for the second ends 266 of the leads 265. The facing element 270 may alternatively be configured to contact the second ends of the leads in order to bend them as described above.

Figure 26:
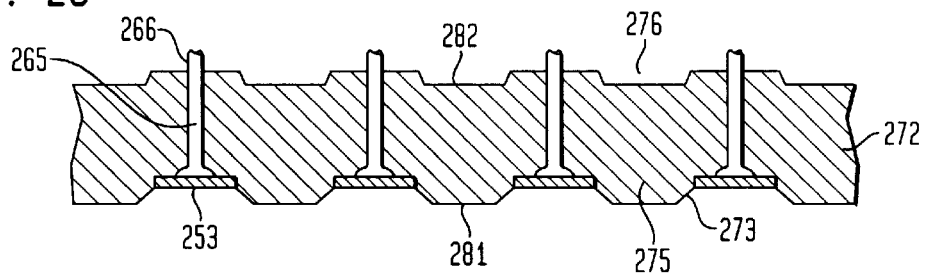

After the compliant layer 272 has been cured, the facing element 270 is removed to be reused in a subsequent process, and the base layer 251 is etched away as described above, leaving the terminal pads 253 attached to the first surface 281 of the compliant layer 272, as shown in FIG. 26.

Figure 27:
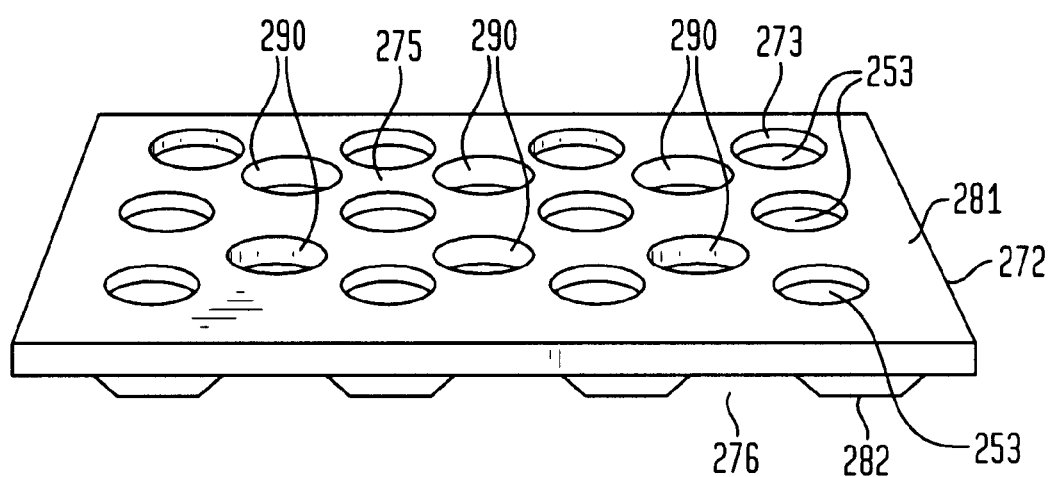
FIG. 27 is a schematic perspective view of a completed component according to one embodiment of the invention.

Connectors formed according to this method of the invention include a compliant body 272 having a first surface 281 and a second surface 282 (FIGS. 26, 27). The first surface 281 of the compliant layer has raised portions 275 surrounding the terminal pads 253. The raised portion 275 includes a conical or sloped surface 273 surrounding the terminal pads 253. The conical or sloped surface 273 is formed by the corresponding sloped portion 256 (FIG. 23) of the first sacrificial base layer. The sloped surfaces 273 of the finished connectors (FIGS. 26, 27) provide lead-ins for ball contacts or other mating terminals by guiding such terminals to the contact pads 253 during engagement. The sloped portions 273 further prevent contacts engaged with the conductive pads 273 from sliding off during relative lateral movement between the connector and the engaged component.

The alternating recesses 276 on the second surface 282, and raised portions 275 on the first surface 281 of the connector give the connector a somewhat zigzag cross-section, as best seen in FIG. 26. Such a cross-section provides empty spaces into which the compliant material may deflect during compression of the connector. The cross-section therefore contributes to the overall compliance of the connector.

Voids or holes 290 (FIG. 27) may also be formed during or after formation of the compliant layer 272. For example, the facing element 270 may have cores (not shown) for forming such holes. The additional holes 290 are provided to further permit deformation of compliant material when subjected to compressive stresses.

In another version of this method, the facing element 270 (FIG. 25) is a second sacrificial base sheet having raised portions 271 on its second major surface. The compliant layer 272 is injected between the first and second base sheets, and the base sheets are later removed by etching.

Where a second sacrificial base sheet is used, it may have conductive terminal pads (not shown) in regions between the raised portions 271. Second ends 266 of the leads 265 are bonded to those terminal pads before injection of the compliant material 272, as described above with respect to the embodiment shown in FIGS. 1–9.

The facing element 270 may alternatively be a lead bonding tool as described with reference to the embodiment of FIGS. 16–20. The second major surface 280 of the facing element 270 in this case is the tool surface, and the leads are fabricated using the lead bonding tool as described above.

The exposed second ends 266 of the leads 265 (FIG. 26) may be coated with a bonding material or may be provided with enlarged ends or with solder balls in order to provide connections to adjacent microelectronic components. The protruding leads may alternatively be etched flush with the second major surface 282 of the compliant layer 272, and subsequently bonded to conductive terminals on a second sacrificial base layer, as described above with reference to FIG. 19.

As these and other variations and combinations of the features discussed above can be utilized without departing from the present invention, the foregoing description of the preferred embodiments should be taken by way of illustration rather than by way of limitation of the present invention as defined by the claims.

What is claimed is:

1. A component for forming connections to a microelectronic unit comprising:
   (a) a compliant sheet-like body having oppositely facing top and bottom surfaces, said top and bottom surfaces defining outside surfaces of said component;
   (b) a plurality of electrically conductive, sheet-like first pads directly attached to said body at said top surface; and
   (c) a plurality of electrically conductive, sheet-like second pads directly attached to said body at said bottom surface; and (d) a plurality of flexible, electrically conductive, elongated leads interconnecting ones of said first conductive pads with corresponding ones of said second conductive pads, said leads extending between said conductive pads through said compliant body and thereby electrically connecting said corresponding first and second conductive pads, said compliant body surrounding and supporting said leads.

2. A component as claimed in claim 1 wherein said leads are curved.

3. A component as claimed in claim 1 wherein said leads have bends.

4. A component as claimed in claim 1 wherein each said lead includes a wire interconnecting said first and second conductive pads.

5. A component as claimed in claim 4 wherein each said wire is bonded to at least one of said first and second bonding pads with a conductive epoxy.

6. A component as claimed in claim 4 wherein each said wire is between about 100 microns and about 1000 microns long and between about 25 microns and about 100 microns in diameter.

7. A component as claimed in claim 1 wherein said compliant, sheet-like body is an elastomeric layer.

8. A component as claimed in claim 1, wherein said first and second conductive pads are gold.

9. A component as claimed in claim 1, wherein said leads are gold.

10. A component as claimed in claim 1, wherein only one lead interconnects each set of said corresponding first and second conductive pads.

11. A component as claimed in claim 1, wherein at least one of said first and second conductive pads have asperities on exposed surfaces.

12. A component as claimed in claim 1, wherein said top surface of said compliant layer includes raised portions surrounding said first conductive pads.

13. A component as claimed in claim 1, wherein said top surface has raised portions, and said bottom surface has recesses corresponding in location to locations of said raised portions.

14. A component as claimed in claim 13, wherein said compliant layer defines a plurality of holes extending substantially from said top surface to said bottom surface, said holes extending in regions of said compliant layer between said leads.

* * * * *